(12) United States Patent
Chao

(10) Patent No.: US 7,944,046 B2
(45) Date of Patent: May 17, 2011

(54) HEAT SPREADER FOR A MULTI-CHIP PACKAGE

(75) Inventor: Tong Wa Chao, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/387,872

(22) Filed: May 8, 2009

(65) Prior Publication Data

US 2009/0219698 A1 Sep. 3, 2009

Related U.S. Application Data

(62) Division of application No. 11/633,960, filed on Dec. 5, 2006, now abandoned.

(51) Int. Cl.
*H01L 23/34* (2006.01)
*F28F 7/00* (2006.01)
*H01L 21/00* (2006.01)

(52) U.S. Cl. ............... 257/713; 257/E23.104; 438/122; 165/185

(58) Field of Classification Search .......... None
See application file for complete search history.

(56) References Cited

U.S. PATENT DOCUMENTS

| | | | | |
|---|---|---|---|---|
| 5,623,394 A * | 4/1997 | Sherif et al. | ................. | 361/705 |
| 5,819,402 A * | 10/1998 | Edwards et al. | ............... | 29/840 |
| 5,880,524 A * | 3/1999 | Xie | ............... | 257/704 |
| 5,990,552 A * | 11/1999 | Xie et al. | ...................... | 257/718 |
| 6,275,381 B1 * | 8/2001 | Edwards et al. | ............. | 361/717 |
| 6,281,573 B1 * | 8/2001 | Atwood et al. | .............. | 257/706 |
| 6,411,507 B1 * | 6/2002 | Akram | ......................... | 361/690 |
| 6,656,770 B2 * | 12/2003 | Atwood et al. | .............. | 438/118 |
| 6,665,187 B1 * | 12/2003 | Alcoe et al. | ..................... | 361/719 |
| 6,979,899 B2 * | 12/2005 | Edwards | ...................... | 257/704 |
| 7,031,162 B2 * | 4/2006 | Arvelo et al. | ................. | 361/718 |
| 7,050,304 B2 * | 5/2006 | Hsu et al. | ..................... | 361/719 |
| 7,098,080 B2 * | 8/2006 | Takeuchi | ..................... | 438/122 |
| 7,186,590 B2 * | 3/2007 | Alcoe et al. | .................. | 438/122 |

\* cited by examiner

*Primary Examiner* — Hoang-Quan T Ho
(74) *Attorney, Agent, or Firm* — Kenneth A. Nelson

(57) ABSTRACT

Embodiments of a heat spreader and an assembly including such a heat spreader are disclosed. The heat spreader includes a stiffening member, which in one embodiment comprises a wall extending from a lower surface of the heat spreader. The wall may be coupled with a substrate, and the addition of this wall may decrease warpage of the substrate and increase package stiffness. The wall may be located between adjacent integrated circuit die that are disposed on the substrate. Other embodiments are described and claimed.

4 Claims, 3 Drawing Sheets

FIG. 3

HEAT SPREADER FOR A MULTI-CHIP PACKAGE

CLAIM OF PRIORITY

This application is a divisional of U.S. patent application Ser. No. 11/633,960, which was filed on Dec. 5, 2006, now abandoned.

FIELD OF THE INVENTION

The disclosed embodiments relate generally to the cooling of integrated circuit (IC) devices, and more particularly to a heat spreader for use in multi-chip packages.

BACKGROUND OF THE INVENTION

Multi-chip assemblies can provide greater integration and enhanced function in a single package. Integration of IC devices fabricated by different process flows into a single package is possible, and can pave the way for system-in-package (SIP) solutions. In addition to the aforementioned benefits, these SIP or multi-chip packages may exhibit reduced form factors, perhaps including both a smaller overall height as well as a smaller footprint—e.g., the surface area occupied by the package on a next-level component, such as a circuit board—as compared to a similar system having multiple, separate components mounted on a circuit board or other substrate.

One challenge facing multi-chip package designers is cooling these devices during operation. Heat removal considerations may be especially acute where two or more processing devices are integrated in a single package (e.g., two or more microprocessors, a combination of a microprocessor and a graphics processor, etc.). A failure to adequately remove heat from a multi-chip package during operation may lead to reliability and performance deficiencies, and perhaps device failure. Issues that may arise in designing a cooling solution for a multi-chip package include mismatches in the coefficient of thermal expansion (CTE), thermally induced stresses (especially where low-k dielectric materials and/or lead-free interconnects are employed) and associated substrate and/or die warpage, delamination at thermal interfaces, compatibility with existing assembly processes and tools, integration of two or more die having differing process flows and perhaps varying thicknesses and sizes, and cost.

DETAILED DESCRIPTION OF THE INVENTION

Figure 1A:
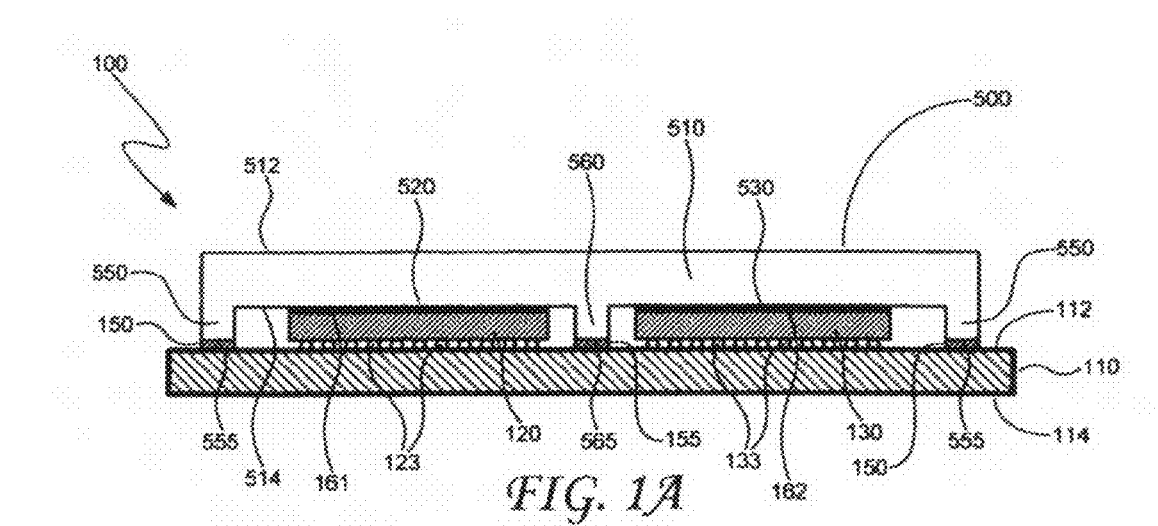
FIG. 1A is a schematic diagram illustrating a cross-section elevation view of an embodiment of a heat spreader including a stiffening member, the heat spreader disposed in a multi-chip package.
Figure 1B:
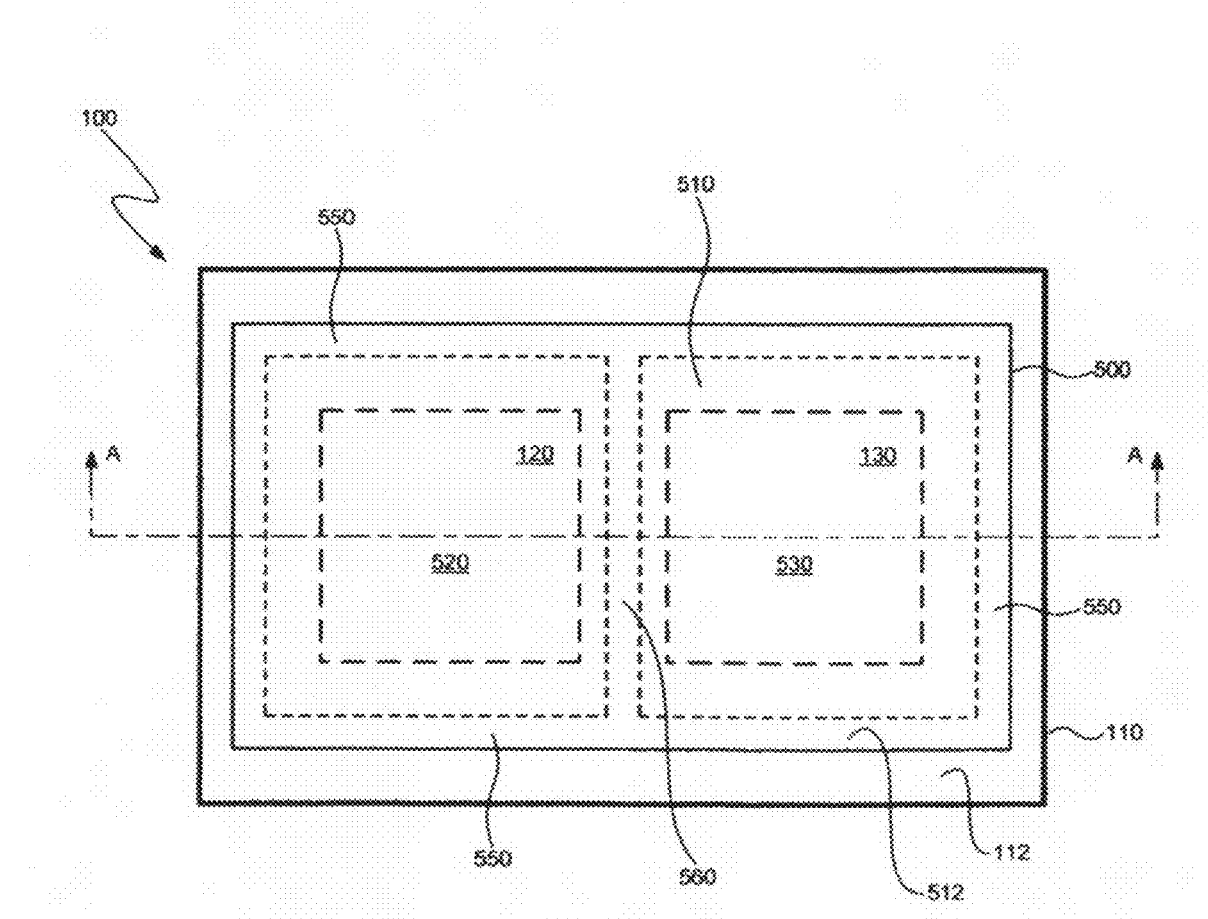
FIG. 1B is a schematic diagram illustrating a plan view of the heat spreader and multi-chip package shown in FIG. 1A.

Referring to FIGS. 1A and 1B, illustrated is a multi-chip package 100. A plan view of the multi-chip package 100 is shown in FIG. 1B, whereas a cross-sectional elevation view of the package 100, as taken along line A-A of FIG. 1B, is shown in FIG. 1A. The multi-chip package 100 includes a substrate 110, a first integrated circuit (IC) die 120, a second IC die 130, and an embodiment of a heat spreader 500. The heat spreader 500 includes a member (e.g., a wall) extending between the heat spreader's body and the underlying substrate 110, and this member can stiffen the package and reduce warpage of the substrate 110. By reducing substrate warpage, the heat spreader 500 may assist in minimizing failures, such as thermal interface delamination, which can lead to improved reliability. Embodiments of this heat spreader are described in greater detail below.

The substrate 110 may comprise any suitable type of package substrate or other die carrier. In one embodiment, the substrate 110 comprises a multilayer substrate including a number of alternating layers of metallization and dielectric material. Each layer of metallization comprises a number of conductors (e.g., traces), and these conductors may comprise any suitable conductive material, such as copper. Further, each metal layer is separated from adjacent metal layers by the dielectric layers, and adjacent metal layers may be electrically interconnected by conductive vias. The dielectric layers may comprise any suitable insulating material—e.g., polymers, including both thermoplastic and thermosetting resins or epoxies, ceramics, etc.—and the alternating layers of metal and dielectric material may be built-up over a core layer of a dielectric material (or perhaps a metallic core).

The substrate includes a first side 112 and an opposing second side 114. A number of lands (not shown in figures) or other electrically conductive terminals are disposed on the substrate's first side 112, and these lands are arranged to couple with a number of terminals (e.g., metal bumps 123, 133, or columns, etc.) extending from each of the IC die 120 and the IC die 130. The substrate lands (or other terminals) are electrically coupled—e.g., as by a reflow process—with the die bumps (or other terminals) to form electrically conductive interconnects between the substrate 110 and each die 120, 130. A number of electrically conductive terminals (not shown in figures), such as metal bumps, columns, pins, etc., may also be disposed on the substrate's second side 114, and these terminals may be used to electrically couple the multi-chip package 100 with a next-level component (e.g., a printed circuit board, etc.).

IC die 120 and IC die 130 may each comprise any desired integrated circuit device. In one embodiment, at least one of the IC die 120, 130 comprises a processing device, such as a microprocessor, a graphics processor, an application specific integrated circuit (ASIC), a field programmable gate array (FPGA), etc. In another embodiment, at least one of the IC die 120, 130 comprises a memory device, such as any type of dynamic random access memory (DRAM), a flash memory, etc. It should be understood that these are but a few examples of the types of IC devices that can be incorporated into the multi-chip package 100 and, further, that the package 100 may include other types of IC devices (e.g., a wireless communications device, a chip set, a MEMS device, a memory controller, etc.). Further, any desired combination of IC devices may be disposed in the multi-chip package 100. By way of example, the multi-chip package may contain two (or more) processing devices (e.g., two microprocessors, a microprocessor and a graphics processor, etc.), a combination of a processing device and a memory device, a combination of a processing device and a wireless communications device, as well as any other suitable combination of devices. Also, the multi-chip package 100 may include one or more passive devices (not shown in figures), such as capacitors, inductors, etc.

The IC die 120 includes a number of metal bumps 123 (or other electrically conductive terminals) and, similarly, the IC die 130 includes a number of metal bumps 133 (or other electrically conductive terminals), as noted above. The metal bumps 123, 133 on the die 120, 130, respectively, will be used to establish electrically conductive interconnects between each die 120, 130 and the substrate 110, as previously described. It should be understood that other types of leads or terminals (e.g., wirebonds, etc.) may also be utilized to form interconnects between the IC die 120, 130 and substrate 110.

With continued reference to FIGS. 1A and 1B, the multi-chip package 100 also includes a heat spreader 500, as noted above. The heat spreader 500 includes a body 510 formed from a thermally conductive material. In one embodiment, the thermally conductive material comprises a metal, such as, for example, copper or an alloy of copper. However, it should be understood that the heat spreader may comprise non-metallic thermally conductive materials (e.g., composite materials, thermally conductive polymers, etc.). The heat spreader body 510 includes an upper surface 512 and an opposing lower surface 514, with the lower surface 514 facing the first IC die 120 and second IC die 130.

The lower surface 514 includes a first die region 520 adapted to be thermally coupled with the first die 120, and this lower surface also includes a second die region 530 adapted to be thermally coupled with the second die 130. To thermally couple the first IC die 120 with the heat spreader 500, a layer of a thermal interface material (TIM) 161 may be disposed between the die 120 and the heat spreader's lower surface 514. Similarly, to thermally couple the second IC die 130 with the heat spreader 500, a TIM layer 162 may be disposed between the die 130 and the lower surface 514. Each of the TIM layers 161, 162 may comprise any suitable thermally conductive material capable of forming a thermally conductive (and perhaps mechanical) bond between the die 120, 130 and heat spreader 500. For example, the TIM layers 161, 162 may comprise solder materials, composite materials, thermally conductive polymers, etc.

Extending around at least a portion of the periphery of the heat spreader 500 is a lip 550. The lip 550 extends from the lower surface 514 and toward the substrate 110. A layer of material 150 (e.g., an adhesive, a sealant, etc.) may be disposed between a lower surface 555 of the lip 550 and the substrate 110. In one embodiment, the material layer 150 comprises an adhesive that helps to secure the heat spreader 500 to the substrate 110 (as suggested above, the TIM layers 161, 162 may also help to secure the heat spreader 500 in place). In another embodiment, the material layer 150 comprises a sealant to provide a seal between the lower surface 555 of lip 550 and the substrate's upper surface 112, and such a seal may prevent (or at least inhibit) contaminates from entering the space between the heat spreader 500 and substrate 110 (and in one embodiment, a hermetic seal may be provided). In some embodiments, the material layer 150 may comprise a substance that functions both as an adhesive and a sealant. The shape of the lip 550 shown in the figures is but one example of such a feature, and it should be understood that this lip may have any other suitable shape or configuration.

The heat spreader 500 further includes a member to provide increased stiffness for the multi-chip package 100. In one embodiment, the stiffening member comprises a wall 560 extending between the heat spreader's lower surface 514 and the substrate 110. A lower surface 565 of the wall 560 may be attached to the substrate by a layer of adhesive 155 (which, in one embodiment, may comprise the same material as material layer 150 disposed between the lip 550 and substrate 110). The addition of the wall 560 that is mechanically coupled with the substrate 110 may reduce warpage of the substrate and increase the stiffness of the multi-chip package 100, as noted above. It should be understood that the wall 560 may be mechanically coupled with the substrate 110 by alternative methods, such as by solder, by mechanical fasteners (e.g., rivets), by an interference fit (e.g., a post on either the wall or substrate extending into a mating hole on the other of the wall and substrate), etc.

According to one embodiment, the wall 560 is disposed between the first IC die 120 and the second IC die 130, and this wall may be referred to as a "partition wall." However, it should be understood that such a partition wall need not be equidistantly spaced between the two die 120, 130 (although it may be in some embodiments), need not extend along the full length of the sides of either die 120, 130 (although it may in some embodiments), and need not extend across the full width of the heat spreader's lower surface 514 (although it may in some embodiments). Further, in yet another embodiment, the wall may be disposed at an alternative location that is not between the IC die 120, 130.

Figure 1C:
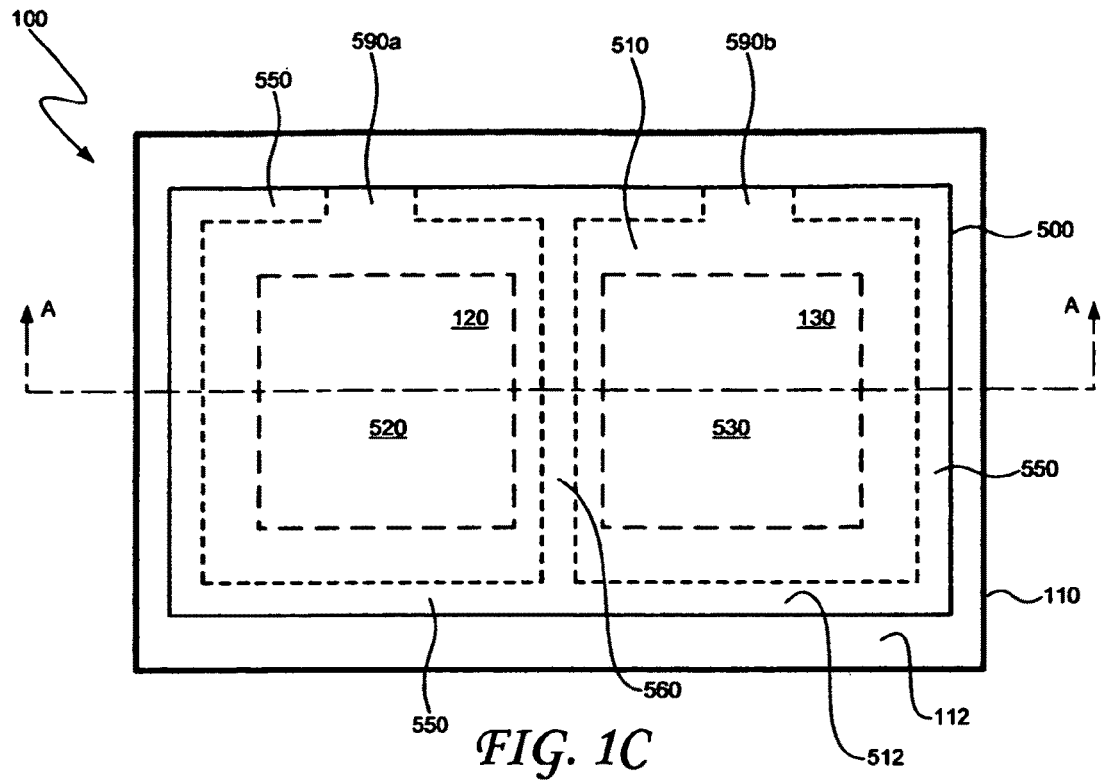
FIG. 1C-1E are schematic diagrams, each illustrating (in plan view) a further alternative embodiment of the heat spreader of FIG. 1A.
Figure 1D:
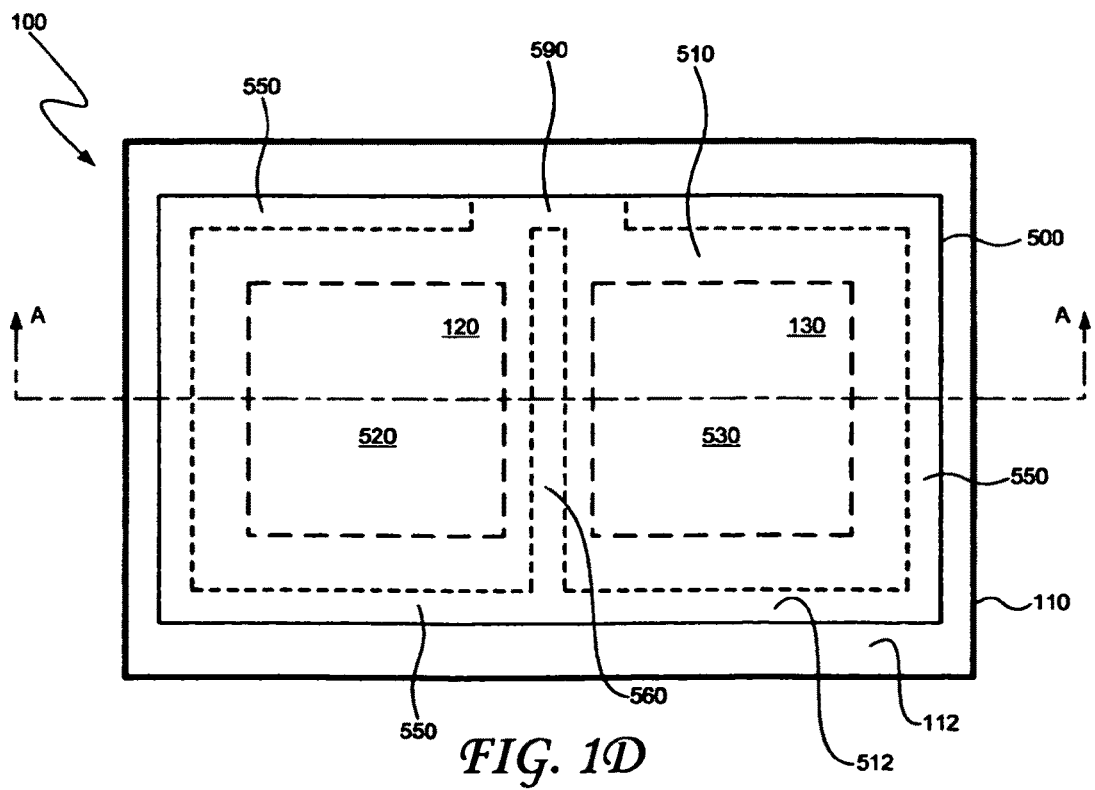

In a further embodiment, the heat spreader 500 may include a vent, and such a vent may allow for the venting of trapped air and/or the outgassing of compounds from die attach materials, TIM materials, adhesives (e.g., adhesive layers 150, 155), etc. For example, with reference to FIG. 1C, in one embodiment the heat spreader 500 may include a first vent 590a and a second vent 590b. Each of the vents 590a, 590b comprises an opening provided by a cut-out in the lip 550, with the vent 590a being disposed proximate the first IC die 120 and the vent 590b being disposed proximate the second IC die 130. By way of further example, with reference to FIG. 1D, in another embodiment the heat spreader 500 includes a single vent 590 that is disposed proximate an end of the wall 560. As before, the vent 590 may comprise an opening provided by a cut-out in the lip 550, and in this embodiment the opening extends across both sides of the wall 560 (to function as a vent for both die 120, 130).

Figure 1E:
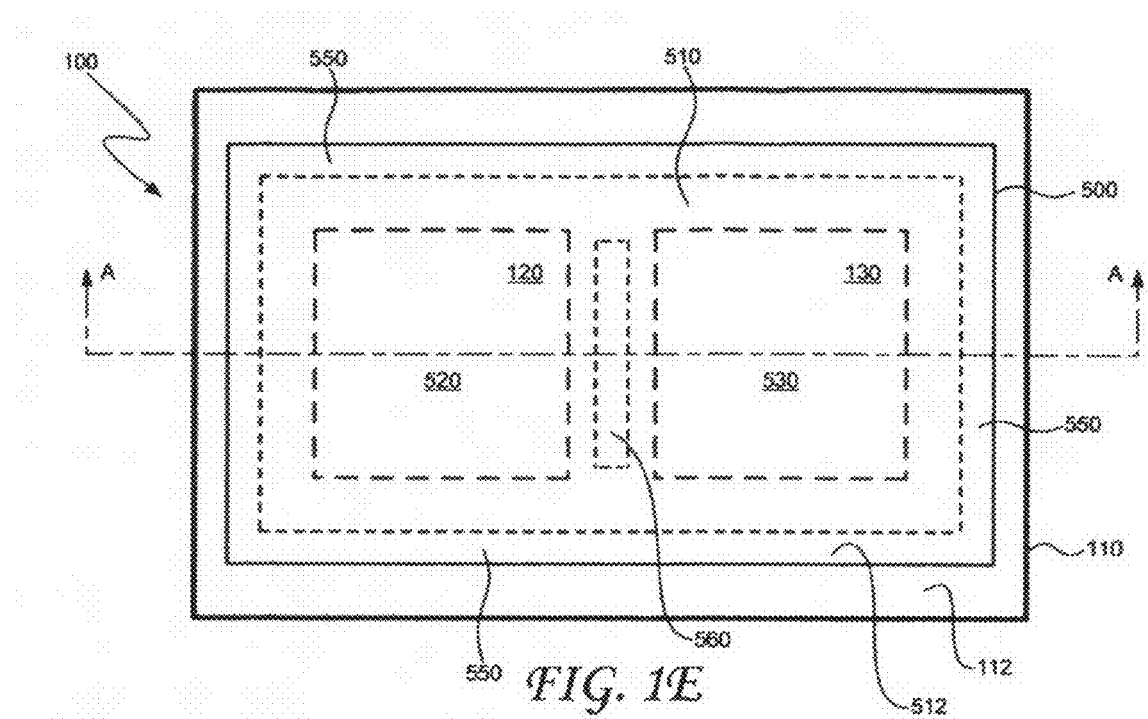

In the embodiment of FIGS. 1A and 1B, the wall 560 extends across the heat spreader's lower surface 514 between opposing sides of the peripheral lip 550. However, as suggested above, the wall 560 may have any other suitable shape or configuration. In another embodiment, for example, the wall 560 may not extend the full width between opposing sides of the lip 550, and this is illustrated in FIG. 1E. Note that, in the embodiment of FIG. 1E, a gap exists between each end of the wall 560 and the peripheral lip 550. In a further embodiment, rather than comprising a continuous wall, the stiffening member may be discontinuous (e.g., a series or row of columns, a series or row of wall sections, a wall having one or more cut-outs, etc.). In yet another embodiment, the stiffening member may comprise multiple walls and/or a matrix (e.g., a honeycomb structure, etc.).

Figure 2:
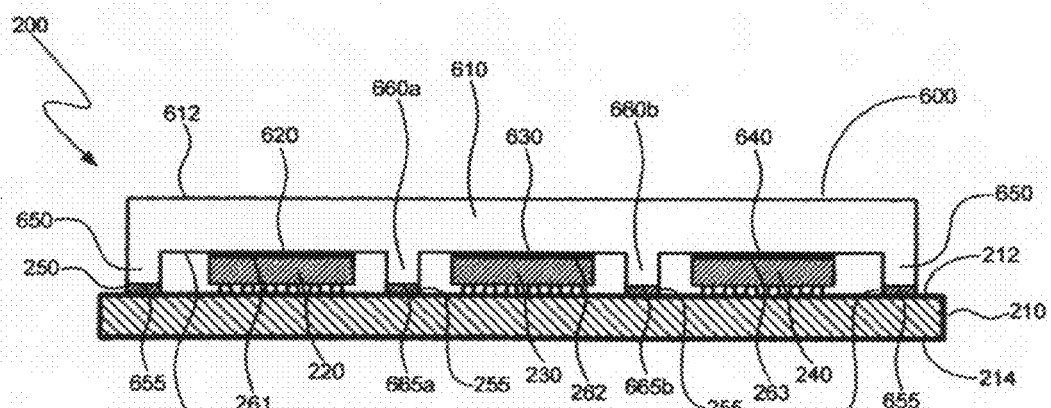
FIG. 2 is a schematic diagram illustrating another embodiment of a heat spreader having a stiffening member, the heat spreader disposed in a multi-chip package.

In the above-described embodiments, the heat spreader extended over two integrated circuit devices. However, embodiments of a heat spreader having a stiffening member may find use with multi-chip packages having any desired number of die (e.g., three or more). By way of example, illustrated in FIG. 2 is an embodiment of a multi-chip package 200 having three integrated circuit devices. Turning to this figure, the multi-chip package includes a first IC device 220, a second IC device 230, and a third IC device 240 disposed on and electrically coupled with a substrate 210. Substrate 210 may comprise a multi-layer structure similar to the substrate 110 described previously, and the IC die 220, 230, 240 and substrate 210 may be electrically interconnected in a manner similar to that described above.

The multi-chip package 200 also includes a heat spreader 600. Heat spreader 600 includes a body 610 formed from a thermally conductive material (e.g., a metal, such as copper or a copper alloy, as well as any suitable non-metallic material). The heat spreader body 610 includes an upper surface 612 and an opposing lower surface 614, with the opposing surface 614 facing the first, second, and third IC die 220, 230, 240. The lower surface 614 includes a first die region 620 adapted to be thermally coupled with the first die 220, a second die region 630 adapted to be thermally coupled with the second die 230, and a third die region 640 adapted to be thermally coupled with the third die 240. TIM layers 261, 262, 263 may be disposed between the die 220, 230, 240, respectively, and the heat spreader's lower surface 614. Each of the TIM layers 261, 262, 263 may comprise any suitable thermally conductive material capable of forming a thermally conductive (and perhaps mechanical) bond between the die 220, 230, 240 and heat spreader 600 (e.g., solder materials, composite materials, thermally conductive polymers, etc.).

Extending around at least a portion of a periphery of the heat spreader 600 is a lip 650, wherein the lip extends from the lower surface 614 and toward the substrate 210. A layer of material 250 (e.g., an adhesive, a sealant, or a material that functions as both an adhesive and sealant, etc.) may be disposed between a lower surface 655 of the lip 650 and the substrate 210. The shape of the lip 650 shown in the figures is but one example of such a feature, and it should be understood that this lip may have any other suitable shape or configuration. Further, in another embodiment, the multi-chip package 200 may include one or more vents, as described above, and such a vent may comprise an opening formed by a cut-out in the lip 650.

The heat spreader 600 further includes two stiffening members to provide increased stiffness for the multi-chip package 200. In one embodiment, the stiffening members comprise a first wall 660a and a second wall 660b, each of the walls 660a, 660b extending between a lower surface 614 of the heat spreader and the substrate 210. The first wall 660a is disposed between the first and second IC die 220, 230, whereas the second wall 660b is disposed between the second and third die 230, 240. A lower surface 665a, 665b of the walls 660a, 660b, respectively, may be attached to the substrate 210 by a layer of adhesive 255 (which, in one embodiment, may comprise the same material as material layer 250 disposed between the lip 650 and substrate 210). The addition of the walls 660a, 660b that are mechanically coupled with the substrate 210 may reduce warpage of the substrate and increase the stiffness of the multi-chip package 200.

As before, it should be understood that the walls 660a, 660b (or other stiffening members) need not be equidistantly spaced between their adjacent die (although they may be in some embodiments), need not extend along the full length of the sides of either adjacent die (although they may in some embodiments), and need not extend across the full width of the heat spreader's lower surface 614 (although they may in some embodiments). Further, in yet another embodiment, either or both of the walls 660a, 660b may be disposed at an alternative location that is not between two die. Also, in a further embodiment, as previously described, either or both of the walls 660a, 660b may be discontinuous or may comprise multiple walls and/or a matrix.

Figure 3:
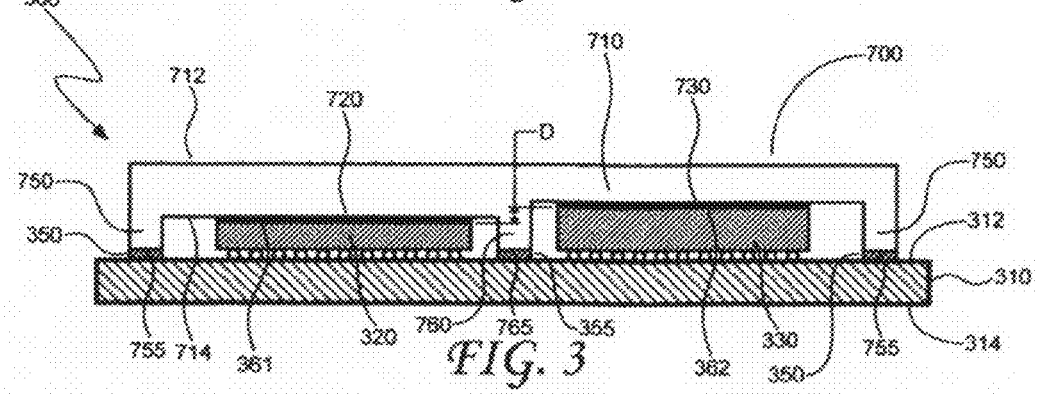
FIG. 3 is a schematic diagram illustrating a further embodiment of a heat spreader having a stiffening member, the heat spreader disposed in a multi-chip package.

In the above-described embodiments, the heat spreader extended over two (or more) integrated circuit devices having substantially the same height. However, embodiments of a heat spreader having a stiffening member may find use with multi-chip packages having IC die of varying height and/or size. For example, illustrated in FIG. 3 is an embodiment of a multi-chip package 300 having two integrated circuit devices of unequal height. Referring to this figure, the multi-chip package 300 includes a first IC device 320 and a second IC device 330 disposed on and electrically coupled with a substrate 310. The second IC die 330 extends above the first IC die 320 by a height (D). Substrate 310 may comprise a multi-layer structure similar to the substrate 110 described previously, and the IC die 320, 330 and substrate 310 may be electrically interconnected in a manner similar to that described above.

The multi-chip package 300 also includes a heat spreader 700. Heat spreader 700 includes a body 710 formed from a thermally conductive material (e.g., a metal, such as copper or a copper alloy, as well as any suitable non-metallic material). The heat spreader body 710 includes an upper surface 712 and an opposing lower surface 714, with the opposing surface 714 facing the first and second IC die 320, 330. The lower surface 714 includes a first die region 720 adapted to be thermally coupled with the first die 320 and a second die region 730 adapted to be thermally coupled with the second die 330. TIM layers 361, 362 may be disposed between the die 320, 330, respectively, and the heat spreader's lower surface 714. Each of the TIM layers 361, 362 may comprise any suitable thermally conductive material capable of forming a thermally conductive (and perhaps mechanical) bond between the die 320, 330 and heat spreader 700 (e.g., solder materials, composite materials, thermally conductive polymers, etc.).

To compensate for the height difference (D) between the IC die 320 and the IC die 330, the lower surface 714 of the heat spreader may be contoured. For example, as shown in the illustrated embodiment, the second die region 730 may be vertically offset from the first die region 720. However, it should be understood that the heat spreader body 710 may be contoured and/or configured in any other suitable manner to compensate for varying die heights.

Extending around a periphery of the heat spreader 700 is a lip 750, wherein the lip extends from the lower surface 714 and toward the substrate 310. A layer of material 350 (e.g., an adhesive, a sealant, or a material that functions as both an adhesive and sealant, etc.) may be disposed between a lower surface 755 of the lip 750 and the substrate 310. Note that portions of the lip 750 may be relatively longer in the vicinity of the second die region 730. The shape of the lip 750 shown in FIG. 3 is but one example of such a feature, and it should be understood that this lip may have any other suitable shape or configuration. Further, in another embodiment, the multi-chip package 300 may include one or more vents, as described above, and such a vent may comprise an opening formed by a cut-out in the lip 750.

The heat spreader 700 further includes a stiffening member to provide increased stiffness for the multi-chip package 300. In one embodiment, the stiffening member comprises a wall 760, with the wall 760 extending between a lower surface 714 of the heat spreader and the substrate 310. The wall 760 is disposed between the first and second IC die 320, 330. A lower surface 765 of the wall 760 may be attached to the substrate 310 by a layer of adhesive 355 (which, in one embodiment, may comprise the same material as material layer 350 disposed between the lip 750 and substrate 310). The addition of the wall 760 mechanically coupled with the substrate 310 may reduce warpage of the substrate and increase the stiffness of the multi-chip package 300. As before, it should be understood that the wall 760 need not be equidistantly spaced between the die 320, 330 (although it may be in some embodiments), need not extend along the full length of the sides of either die 320, 330 (although it may in some embodiments), and need not extend across the full width of the heat spreader's lower surface 714 (although it may in some embodiments). Further, in another embodiment, the wall 760 may be disposed at an alternative location that is not between two die, and in yet a further embodiment the wall 760 may be discontinuous or may comprise multiple walls and/or a matrix.

The heat spreader 500, 600, 700 may be fabricated using any suitable processes or combination of processes. For example, the heat spreader may be fabricated by machining (e.g., milling, laser machining, etc.), injection molding, stamping, or any combination of these and/or other processes. According to one embodiment, the heat spreader is fabricated from a single piece of material. In a further embodiment, the heat spreader is fabricated from separate pieces of material that are joined together (e.g., as by welding, adhesive bonding, fasteners, etc.). The heat spreader may have any suitable size and shape, depending upon the configuration of the multi-chip package and the type and size IC devices disposed therein.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A heat spreader comprising:
   a body formed of a thermally conductive material, the body including a surface having a first region to mate with a first die and a second region to mate with a second die; and
   a wall disposed between the first and second regions and extending from the surface, wherein the first region is vertically offset relative to the second region to compensate for a height difference between the first die and the second die;
   a lip disposed about at least a portion of a periphery of the body, the lip extending from the surface of the body; and
   a cut-out in the lip, wherein the cut-out extends across both sides of the wall and provides a ventilation opening to both the first die and the second die.

2. The heat spreader of claim 1, further comprising:
   a third region on the surface of the body to mate with a third die; and
   a second wall disposed between the second and third regions and extending from the surface.

3. An assembly comprising:
   a substrate;
   a first die coupled with the substrate;
   a second die coupled with the substrate; and
   a heat spreader thermally coupled with a surface of the first die and with a surface of the second die, the heat spreader including a wall extending toward the substrate at a location between the first die and the second die and further including a lip disposed about at least a portion of the heat spreader, wherein the wall is coupled with the substrate, wherein a surface of the heat spreader facing the first die and the second die is contoured to compensate for a height difference between the first die and the second die, and wherein the lip contains a cut-out extending across both sides of the wall and providing a ventilation opening to both the first die and the second die.

4. The assembly of claim 3, further comprising:
   at least one other die coupled with the substrate, wherein the heat spreader is thermally coupled with a surface of the other die;
   wherein the heat spreader further includes a second wall extending toward the substrate at a location between the second die and the one other die.

\* \* \* \* \*